(12) United States Patent
Kobayashi et al.

(10) Patent No.: US 7,943,524 B2
(45) Date of Patent: May 17, 2011

(54) METHOD OF ETCHING AND ETCHING APPARATUS

(75) Inventors: Noriyuki Kobayashi, Yamanashi (JP); Kenji Adachi, Hsin-chu (TW)

(73) Assignee: Tokyo Electrons Limited, Tokyo (JP)

( * ) Notice: Subject to any disclaimer, the term of this patent is extended or adjusted under 35 U.S.C. 154(b) by 668 days.

(21) Appl. No.: 11/780,797

(22) Filed: Jul. 20, 2007

(65) Prior Publication Data

US 2008/0014749 A1 Jan. 17, 2008

Related U.S. Application Data

(60) Division of application No. 10/938,789, filed on Sep. 13, 2004, now abandoned, which is a continuation of application No. PCT/JP03/02870, filed on Mar. 11, 2003.

(30) Foreign Application Priority Data

Mar. 12, 2002 (JP) .................................. 2002-66343

(51) Int. Cl.
 *H01L 21/302* (2006.01)
(52) U.S. Cl. ........ 438/723; 438/724; 438/729; 438/743; 438/744
(58) Field of Classification Search .................. 438/723, 438/724, 729, 743, 744
See application file for complete search history.

(56) References Cited

U.S. PATENT DOCUMENTS

| | | | |
|---|---|---|---|
| 5,948,701 A | 9/1999 | Chooi et al. | |
| 6,040,223 A | 3/2000 | Liu et al. | |
| 6,117,786 A | 9/2000 | Khajehnouri et al. | |
| 6,217,786 B1 | 4/2001 | Hills et al. | |
| 6,544,429 B1 | 4/2003 | Hung et al. | |
| 6,602,434 B1 | 8/2003 | Hung et al. | |
| 6,617,253 B1 | 9/2003 | Chu et al. | |
| 6,797,189 B2 | 9/2004 | Hung et al. | |
| 6,838,388 B2 | 1/2005 | Tadokoro et al. | |
| 6,849,193 B2 | 2/2005 | Hung et al. | |
| 2002/0001963 A1 | 1/2002 | Tadokoro et al. | |
| 2002/0055263 A1* | 5/2002 | Igarashi et al. ............... | 438/710 |
| 2002/0142610 A1* | 10/2002 | Chien et al. ................... | 438/710 |
| 2003/0024902 A1* | 2/2003 | Li et al. .......................... | 216/67 |

FOREIGN PATENT DOCUMENTS

| | | |
|---|---|---|
| JP | 2001-68462 | 3/2001 |
| WO | WO 99/57757 | 11/1999 |
| WO | WO 00/59021 | 10/2000 |

* cited by examiner

*Primary Examiner* — Binh X Tran (74) *Attorney, Agent, or Firm* — Oblon, Spivak, McClelland, Maier & Neustadt, L.L.P.

(57) ABSTRACT

Silicon oxide film having, as a sublayer, a silicon nitride film layer serving as a protective film layer for 5 gate formed on silicon substrate is etched by introducing a processing gas including a gaseous mixture containing at least $C_4F_6$, Ar, $O_2$ and $N_2$ into an airtight processing chamber and carrying out a plasma treatment in a self-alignment contact process, thereby forming contact hole. For the 10 processing gas, e.g., the ratio of $N_2$ gas flow rate to $C_4F_6$ gas flow rate ranges from 25/8 to 85/8, the ratio of $O_2$ and $N_2$ gas flow rate to $C_4F_6$ gas flow rate ranges from 15/4 to 45/4 and the ratio of $N_2$ gas flow rate to $O_2$ gas flow rate ranges from 5 to 17. Accordingly, stable contact holes of 15 high aspect ratio exhibiting desirable control characteristics is formed while minimizing etching the silicon nitride film, a protective film layer for gate.

12 Claims, 4 Drawing Sheets

METHOD OF ETCHING AND ETCHING APPARATUS

CROSS-REFERENCE TO RELATED APPLICATIONS

This application is a Divisional Application of U.S. application Ser. No. 10/938,789, filed on Sep. 13, 2004, now abandoned, which is a Continuation Application of PCT International Application No. PCT/JP03/02870 filed on Mar. 11, 2003 (which designated United States) which claims priority to JP 2002-66343, filed on Mar. 12, 2002, the contents of each of which are incorporated herein by reference.

FIELD OF THE INVENTION

The present invention relates to an etching method and an etching apparatus, employed to a manufacturing process of a semiconductor device.

BACKGROUND OF THE INVENTION

Figure 4:
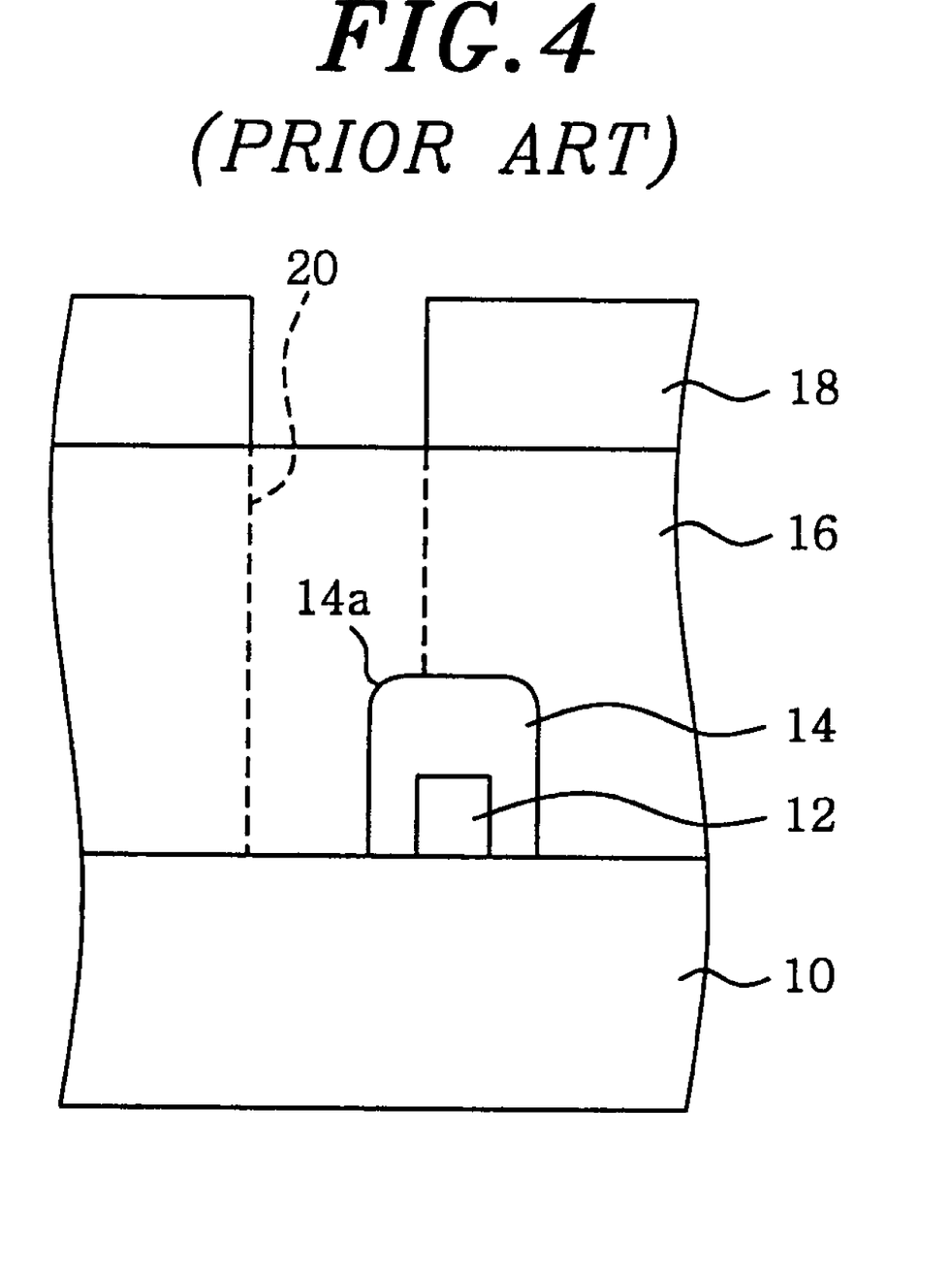
FIG. 4 is a sectional view of an objective substrate illustrating the etching of the objective substrate in accordance with a conventional etching method.

As shown in FIG. 4, in case of forming a contact hole 20 by a plasma etching through an insulating film layer 16, which covers a gate 12 formed on a semiconductor substrate 10 such as a silicon substrate, and is made of a silicon oxide film such as $SiO_2$, a self-alignment contact technology 20 may be applied. In the self-alignment contact technology, the contact hole 20 is formed in a self-aligning manner in a small and compact area between gates 12 while a protective film layer 14 such as a silicon nitride (SiN) film is formed on each gate 12, thereby preventing the gate 12 from being etched in the course of forming the contact hole 20.

When the contact hole 20 is formed by employing the self-alignment contact technology, there is used a CF-based gas, such as $C_4F_8$, as a processing gas in case of processing the plasma etching, and a gaseous mixture including $O_2$ is used as an etching gas for removing deposits. With a recent improvement in the integration of the semiconductor devices and increased demands for a miniaturization of various elements formed on a semiconductor substrate, the design rule has become even finer. Consequently, it has become necessary to reduce a gap between gates (electrodes) formed on the semiconductor substrate and thus a high aspect ratio of a contact hole formed between the gates (electrodes) is required. However, the plasma etching employing the conventional processing gases as described above is disadvantageous in that as the aspect ratio of the contact hole becomes higher, because of the narrow gaps between the gates, the etching time becomes longer to prevent degradation of the capability to pierce an etching target and occurrence of an etching stop. However, as shown in FIG. 4, a large portion of a shoulder (edge) 14a of the silicon nitride film, acting as a protective film layer formed on a surface of the gate 12, is extended into an inner space of the contact hole 20 to be formed through the silicon oxide film acting as the insulating film layer 16. Therefore, the shoulder 14a may be very readily etched. Furthermore, the shoulder (edge) 14a of the protective film layer 14 may be severely etched depending on etching selectivity of the insulating film layer 16 over the protective film layer 14 of the gate 12, thereby rendering the gate 12 undesirably exposed thereto.

SUMMARY OF THE INVENTION

Therefore, the present invention has been made to ameliorate the above-described disadvantages in the prior arts and an object of the present invention is to provide a novel and improved etching method and etching apparatus thereof assuring an excellent controllability, in which etching selectivity of a silicon oxide film layer against a silicon nitride film layer of a gate can be increased. Thereby, the silicon nitride film layer, acting as a protective film layer of the gate, can be strongly prevented from being etched while it becomes possible to form a contact hole with a high aspect ratio possible.

In accordance with one aspect of the invention, there is provided an etching method, in which a processing gas is fed into an airtight processing chamber to generate a plasma therein and a silicon-containing oxide film formed on an object to be processed disposed in the processing chamber is selectively etched against a silicon nitride film, wherein the processing gas is a gaseous mixture including at least a fluorocarbon-based gas, a first deposit removing gas and a second deposit removing gas having a weaker deposit removing capability than the first deposit removing gas.

In accordance with another aspect of the invention, there is provided an etching apparatus, in which a processing gas is fed into an airtight processing chamber to generate a plasma therein and a silicon-containing oxide film formed on an object to be processed disposed in the processing chamber is selectively etched against a silicon nitride film, wherein the processing gas is a gaseous mixture including at least a fluorocarbon-based gas, a first deposit removing gas and a second deposit removing gas having a weaker deposit removing capability than the first deposit removing gas.

Further, in the etching method and the apparatus thereof, an etching selectivity of the silicon-containing oxide film over the silicon nitride film is preferably set to a predetermined value by a ratio of a total flow rate of the first and the second deposit removing gases to a flow rate of the fluorocarbon-based gas, and a ratio of a flow rate of the second deposit removing gas to the flow rate of the fluorocarbon-based gas.

Furthermore, in the etching method and the apparatus thereof, the silicon-containing oxide film is preferably a silicon oxide film, the fluorocarbon-based gas is $C_4F_6$ gas, the first deposit removing gas is oxygen gas and the second deposit removing gas is nitrogen gas preferably. Additionally, the processing gas preferably includes an inert gas.

Moreover, in the etching method and the apparatus thereof, as for the processing gas, a ratio of a flow rate of the $N_2$ gas to a flow rate of the $C_4F_6$ gas is preferably greater than or equal to about 25/8 and less than or equal to about 85/8, and a ratio of a total flow rate of the $O_2$ gas and the $N_2$ gas to the flow rate of the $C_4F_6$ gas is preferably greater than or equal to about 15/4 and less than or equal to about 45/4.

Further, in the etching method and the apparatus thereof, as for the processing gas, the ratio of the flow rate of the $N_2$ gas to the flow rate of the $C_4F_6$ gas is preferably greater than or equal to about 25/8 and less than or equal to about 85/8, and a ratio of the flow rate of the $N_2$ gas to the flow rate of the $O_2$ gas is preferably greater than or equal to about 5 and less than or equal to about 17.

Furthermore, in the etching method and the apparatus thereof, an upper and a lower electrodes are installed opposite to face each other in the processing chamber, a first high frequency power is applied to the upper electrode, a frequency of a second high frequency power is applied to the lower electrode, a frequency of the second high frequency power being lower than that of the first high frequency power. The frequency of the first high frequency power is about 60 MHz and that of the second high frequency power is about 2 MHz, preferably.

Moreover, in the etching method and the apparatus thereof, the silicon nitride film exists under the silicon oxide film, and the silicon oxide film is etched in a self-alignment contact process.

In accordance with the present invention as described above, it is possible to increase the etching rate of the silicon oxide film acting as an insulating film layer, while preventing an etching stop from occurring. Further, it is possible to improve etching selectivity of the silicon oxide film over the silicon nitride film, acting as a protective film layer of a gate. Therefore, the silicon nitride film, acting as the protective film layer of the gate, is prevented from being etched and a contact hole with a high aspect ratio may be stably formed while assuring an excellent controllability. Thereby, the present invention satisfies recent demands for improved integration of a semiconductor device and miniaturization of various elements formed on a semiconductor substrate Meanwhile, throughout the specification, 1 mTorr is equivalent to $(10^{-3} \times 101325/760)$ Pa and 1 sccm is equivalent to $(10^{-6}/60) m^3/sec$.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
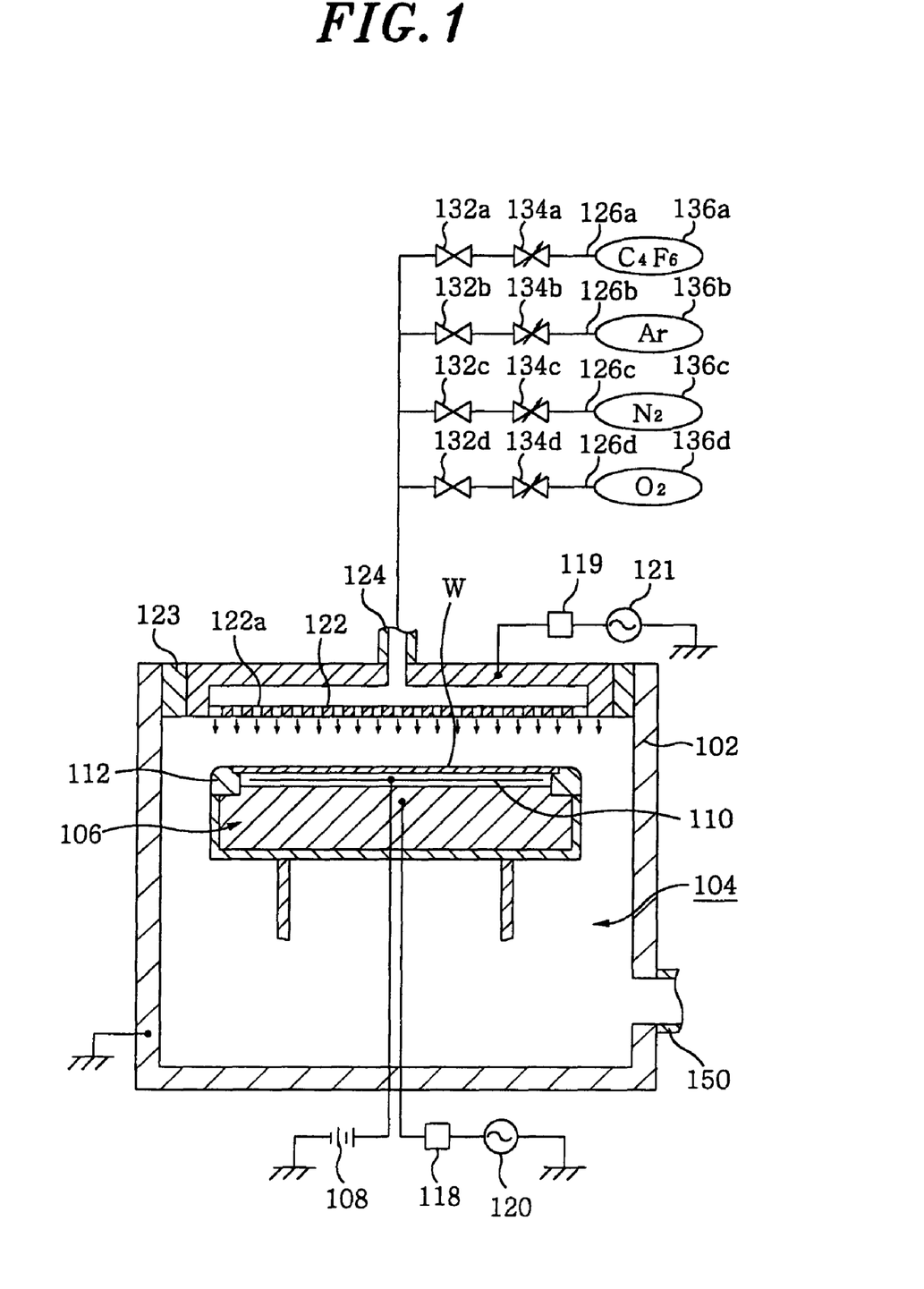
FIG. 1 schematically illustrates an etching apparatus, to which an etching method in accordance with the present invention may be applied.

Hereinafter, preferred embodiments of an etching method and an etching apparatus in accordance with the present invention will now be described in detail with reference to the accompanying drawings. FIG. 1 schematically illustrates a parallel plate type plasma etching apparatus, which is an embodiment of the etching apparatus in accordance with the present invention.

The plasma etching apparatus 100 includes a processing chamber 104 defined by a securely grounded processing vessel 1 $O_2$, and a vertically movable lower electrode 106 included in a suscepter is installed in the processing chamber 104. An electrostatic chuck 110 connected to a high voltage DC power supply 108 is provided at an upper part of the lower 5 electrode 106 and an object to be processed, for example a semiconductor wafer (hereinafter, referred to as "wafer") W, is loaded on the electrostatic chuck 106. Further, an insulating focus ring 112 is installed around the wafer W loaded on the lower electrode 106. Furthermore, the lower electrode 106 is connected to a second high frequency power supply 120 via a matching unit 118.

In addition, an upper electrode 122 having a plurality of gas discharge openings 122a is provided at a top of the processing chamber 104, the top thereof facing against the lower electrode 106. An insulator 123 is interposed between the upper electrode 122 and the processing vessel 102 to electrically isolate the upper electrode 122 from the processing vessel 102. As well, the upper electrode 122 is connected via a matching unit 119 to a first high frequency power supply 121 generating high frequency power to produce a plasma.

In this regard, a first high frequency power having a frequency ranging from about 13.56 to about 150 MHz, and preferably about 60 MHz, is applied from the first high frequency power supply 121 to the upper electrode 122. Furthermore, a second high frequency power is applied from the second high frequency power supply 120 to the lower electrode 106, a frequency of the second high frequency power being lower than that of the first high frequency power generated from the first high frequency power supply 121. For example, the frequency of the second high frequency power ranges from about 2 to about 13.56 MHz, and is preferably about 2 MHz.

A gas supply line 124 communicates with the gas discharge openings 122a, wherein the gas supply line 124 is connected to a processing gas supplying system 126a for supplying, for example, $C_4F_6$, a processing gas supplying system 126b for supplying, for example, Ar, a processing gas supplying system 126c for supplying, for example, $N_2$, and a processing gas supplying system 126d for supplying, for example, $O_2$.

Each of the processing gas supplying systems 126a, 126b, 126c and 126d includes each of opening/closing valves 132a, 132b, 132c and 132d, respectively; includes each of flow rate controlling valves 134a, 134b, 134c and 134d, respectively; and are connected to a $C_4F_6$ gas supply source 136a, an Ar gas supply source 136b, a $N_2$ gas supply source 136c and an $O_2$ gas supply source 136d, respectively.

Additionally, a gas exhaust line 150 communicating with a vacuum exhaust unit (not shown) is formed at a lower part of the processing vessel 1 $O_2$ and an inner space of the processing chamber 104 is maintained under reduced pressure by the vacuum exhaust unit.

Figure 2A:
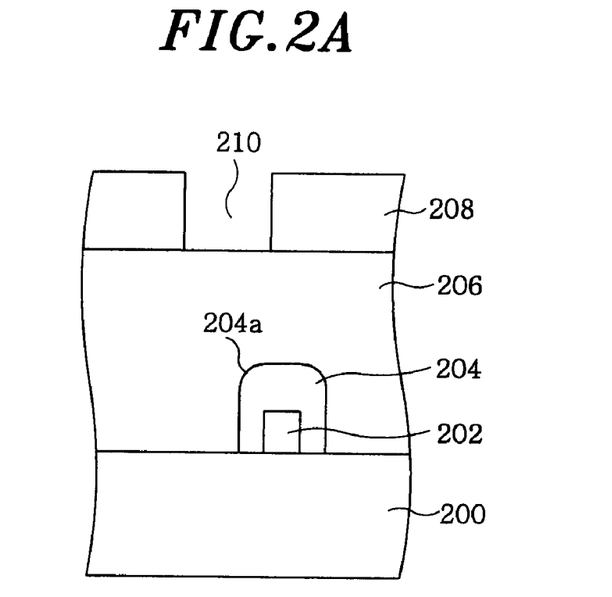
FIGS. 2a and 2b are sectional views of an objective substrate illustrating the etching of the objective substrate in accordance with the present invention.

Hereinafter, there will be described the etching method employing the above-described etching apparatus in accordance with the present invention, with reference to FIGS. 2A and 2B. Referring to FIG. 2A, there is illustrated an example of layered structure of films, which will be etched in accordance with the present invention.

The layered structure of films is formed in accordance with the following procedure. After a gate 202 is formed on a silicon (Si) substrate 200 as a semiconductor substrate, a silicon nitride film layer 204 as a protective film layer is formed thereon in such a way that the gate 202 is coated over therewith. Subsequently, a silicon oxide film layer 206, which includes $SiO_2$ and the like and acts as an insulating film layer, is formed on an entire surface of the resulting substrate by, for example, a chemical vapor deposition (CVD) process. Successively, a photoresist film is applied on the silicon oxide film layer 206 and then patterned to form a contact hole 210 therethrough, thereby forming the photoresist layer 208.

Next, the silicon oxide film layer 206 of the resulting layered structure of films is selectively etched against the silicon nitride film layer 204 by the etching method in accordance with the present invention to form the contact hole between the gates 202. In detail, a processing gas, which includes a $C_4F_6$ gas as a fluorocarbon-based gas, an $O_2$ (oxygen) gas as a first deposit removing gas, a $N_2$ (nitrogen) gas as a second deposit removing gas and a gaseous mixture containing Ar, is introduced into the processing chamber 104 to conduct a plasma process, thereby performing the etching. At this time, the $C_4F_6$ gas is used as an etching gas, and the Ar-containing gas is used as a dilution gas. Additionally, the $O_2$ and the $N_2$ gas are used to remove deposits generated by the etching.

With respect to this, the reason why $N_2$ gas is included as the gas for removing the deposits in addition to $O_2$ gas is because it is much easier to achieve a fine tuning in control over removing the deposits by controlling the flow rate of $N_2$ than controlling that of $O_2$, since $N_2$ is much less powerful in removing the deposits than $O_2$. To be more specific, an amount of the deposits removed is increased as a flow rate of the deposit removing gas such as $N_2$ or $O_2$, increases. In such a case, $O_2$ and $N_2$ have different deposit removing rates from each other. For the case of $N_2$, an increase rate of the removed amount of deposit to an increase of its flow rate (a deposit removing capability) is a level of about 1/10-1/20 of that of $O_2$. For the case of $O_2$, a small increase in the flow rate of $O_2$ causes a big increase in the amount of the deposits removed, resulting in an excessive removal of the deposits.

In the case of the layered structure of films in accordance with the present embodiment, if the deposit is excessively removed, an etching selectivity of the silicon oxide film layer 206, acting as the insulating film layer, over the silicon nitride film layer 204, acting as the protective film layer of the gates, cannot be maintained high. Therefore, $N_2$, which removes a relatively small amount of the deposit for an increase in its flow rate, is contained in the processing gas to readily control the amount of the removed deposit.

However, if the processing gas does not contain $O_2$ but $N_2$, and then since the $N_2$ gas has relatively poor deposit removing capability, the deposit is insufficiently removed, thereby rendering an etching stop occurring. Therefore, in the present invention, $O_2$ as well as $N_2$ is included in the processing gas.

Furthermore, since $N_2$ has some deposit removing capability even though it is relatively poor, the etching selectivity of the silicon oxide film layer 206 over the silicon nitride film layer 204 cannot be made high, when its flow rate is excessively high. Therefore, it is necessary to properly control respective flow rates of gases, including $N_2$.

In this respect, there will be described a result of an experiment in which an etching of the silicon oxide film layer 206 was performed, in the layered structure of films as shown in FIG. 2a, which was conducted in order to find respective preferable flow rates of the gases. The etching experiment was conducted under basic conditions that pressure in the processing chamber 104 was 30 mTorr, a high frequency power applied to the upper electrode 122 was 1530 W at 60 MHz, a high frequency power (bias power) applied to a lower electrode 106 was 1350 W at 2 MHz and a gap between the upper and the lower electrodes 122 and 106 was 25 mm. Further, a flow rate ratio of $C_4F_6/Ar/O_2$ (a flow rate of $C_4F_6$/a flow rate of Ar/a flow rate of $O_2$) was 16 sccm/800 sccm/10 sccm, temperatures of the lower and the upper electrodes in the processing chamber 104 were 40° C. and 60° C., respectively and a temperature of a sidewall of the processing chamber 104 was 50° C. Pressures of a cooling gas as a back pressure gas (He gas) applied to the center and edges of a backside of the wafer were 5 Torr and 10 Torr, respectively.

Figure 2B:
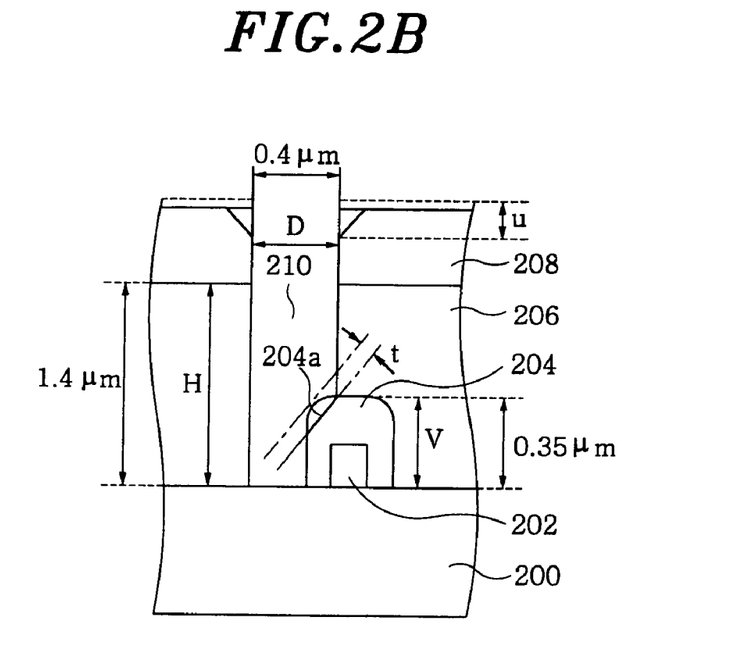

In this regard, when forming a contact hole with a height H of 1.4 μm and a diameter of 0.4 μm and having a silicon nitride film layer 204 having a height of 0.35 μm from a surface of the silicon substrate 200, as shown in FIG. 2b, the etching could be conducted under a 100% over-etching condition by only controlling the flow rate of $N_2$. At this time, the 100% over-etching condition means that the etching was performed for a time required-to remove a layer that was twice as thick as the silicon oxide film layer 206.

When the flow rate of $N_2$ was 200 sccm, in other words, when a flow rate ratio of $C_4F_6/Ar/N_2/O_2$ (the flow rate of $C_4F_6$/the flow rate of Ar/the flow rate of $N_2$/the flow rate of $O_2$) was 16 sccm/800 sccm/200 sccm/10 sccm, etching rates of the silicon oxide film layer at the center portion, at an intermediate portion between an end portion and the center portion and at the end portion of the wafer W were 491.3 nm/mm, 478.0 nm/mm and 449.3 nm/mm, respectively. Additionally, removal amounts t's of the shoulder (edge) 204a of the silicon nitride film layers 204 were 112 nm, 118 nm and 134 nm, respectively, while selectivities of the 10 silicon oxide film layer 206 over the shoulder (edge) 204a of the silicon nitride film layers 204 [an etching rate of the silicon oxide film layer/an etching rate of the shoulder part (edge part) of the silicon nitride film layer] were 17.4, 15.9 and 12.6, respectively. At this time, selectivities of the silicon oxide film layer 206 over the shoulder parts (edge part) of the photoresist layer 208 [an etching rate of the silicon oxide film layer/an etching rate of the shoulder part (edge part) of the photoresist layer] were 4.6, 5.2 and 5.0, respectively.

In this respect, the removed amount of the shoulder (edge) 204a of the silicon nitride film layer 204 was represented by a distance t between two straight lines which were inclined by an angle of 45 degrees with respect to the silicon substrate 200 and were drawn at the shoulder 204a before and after, respectively, the silicon nitride film layer 204 was etched as shown in FIG. 2B. As well, a—14—removed amount of a shoulder part (edge part) of the photoresist layer 208 was represented by a distance u between an upper surface of the photoresist layer 208 before the photoresist layer 208 was etched and a point, at which an etched portion of the photoresist layer 208 met a wall of the contact hole after the photoresist layer 208 was etched as shown in FIG. 2B.

Furthermore, when the flow rate of $N_2$ was 150 sccm, in other words, when the flow rate ratio of $C_4F_6/Ar/N_2/O_2$ (the flow rate of $C_4F_6$/the flow rate of Ar/the flow rate of $N_2$/the flow rate of $O_2$) was 16 sccm/800 sccm/150 sccm/10 sccm, etching rates of the silicon oxide film layer at the center portion, at the intermediate portion between the end portion and the center portion and at the end portion of the wafer W were 508.7 nm/mm, 502.0 nm/mm and 474.0 nm/mm, respectively. Additionally, the removal amounts t's of the shoulder (edge) 204a of the silicon nitride film layers 204 were 84 nm, 73 nm and 84 nm, respectively, while the selectivities of the silicon oxide film layer 206 over the shoulder (edge) 204a of the silicon nitride film layers 204 [an etching rate of the silicon oxide film layer/an etching rate of the shoulder part (edge part) of the silicon nitride film layer] were 23.1, 26.0 and 20.5, respectively. At this time, the selectivities of the silicon oxide film layer 206 over the shoulder parts (edge part) of the photoresist layer 208 [the etching rate of the silicon oxide film layer/the etching rate of the shoulder part (edge part) of the photoresist layer] were 5.2, 7.8 and 7.8, respectively.

Additionally, when the flow rate of $N_2$ was 100 sccm, in 5 other words, when the flow rate ratio of $C_4F_6/Ar/N_2/O_2$ (the flow rate of $C_4F_6$/the flow rate of Ar/the flow rate of $N_2$/the flow rate of $O_2$) was 16 sccm/800 sccm/100 sccm/10 sccm, the etching rates of the silicon oxide film layer at the center portion, at the intermediate portion between the end portion and the center portion and at the end portion of the wafer W were 539.3 nm/mm, 524.0 nm/mm, and 500.0 nm/mm, respectively. Further, the removed amounts t's of the shoulder (edge) 204a of the silicon nitride film layers 204 were 47 nm, 51 nm and 65 nm, respectively, while the selectivities of the silicon oxide film layer 206 over the shoulder (edge) 204a of the silicon nitride film layers 204 [an etching rate of the silicon oxide film layer/an etching rate of the shoulder part (edge part) of the silicon nitride film layer] were 41.3, 36.4 and 26.6, respectively. At this time, the selectivities of the silicon oxide film layer 206 over the shoulder parts (edge part)

of the photoresist layer 208 [the etching rate of the silicon oxide film layer/the etching rate of the shoulder part (edge part) of the photoresist layer] were 6.6, 6.8 and 10.0, respectively.

Figure 3:
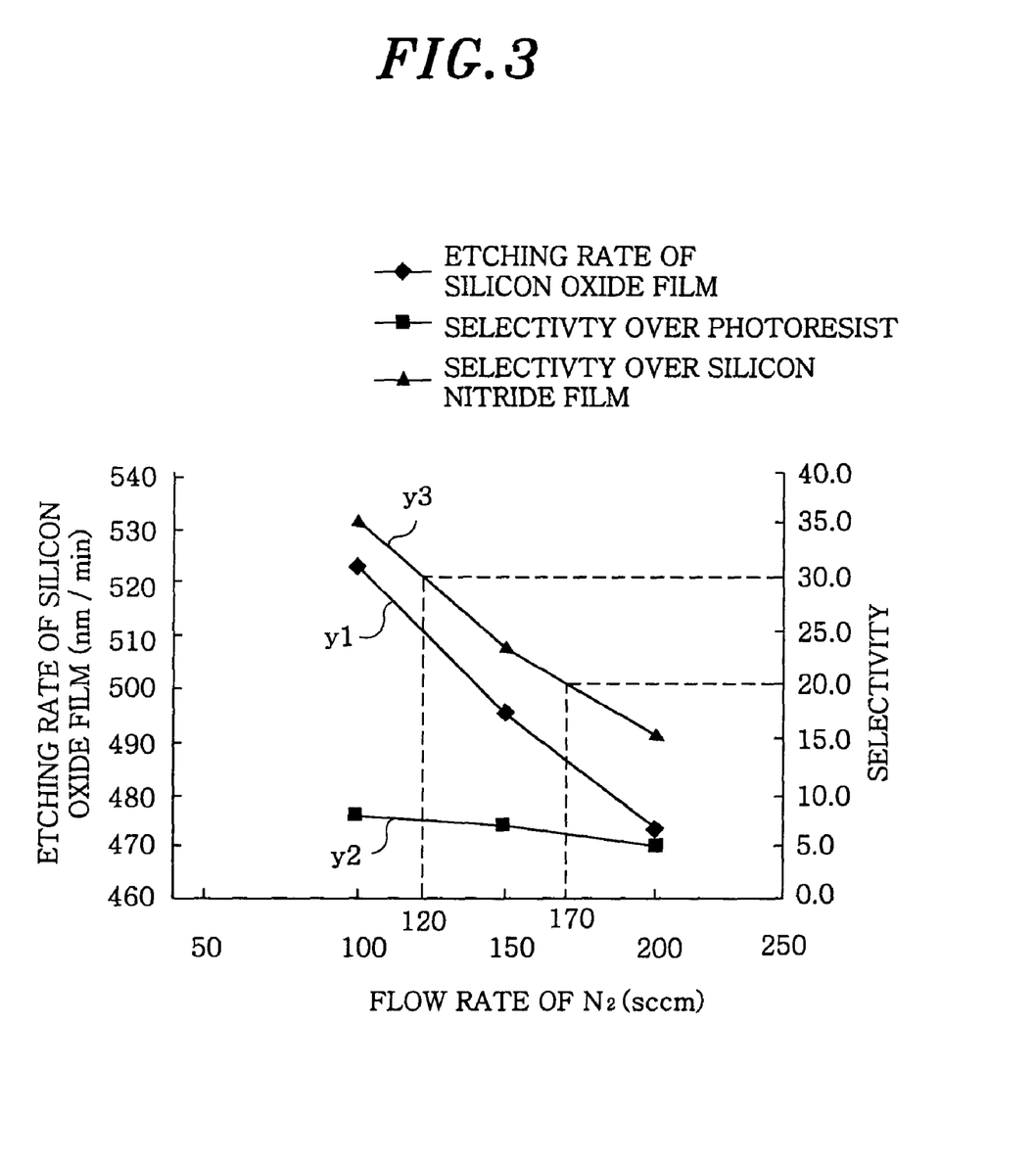
FIG. 3 is a graph showing the results of the etching 10 of a silicon oxide film layer in accordance with the present invention.

The above results are shown in FIG. 3. A horizontal axis represents the flow rate of the $N_2$ gas and vertical axes correspond to the etching rate and selectivity of the silicon oxide film layer, respectively. Further, averages of the values at the center portion, at the intermediate portion between the end portion and the center portion, and at the end portion of the wafer W are taken and plotted in FIG. 3.

In this regard, a line y1 is a graph showing an interrelation between the flow rate of $N_2$ and the etching rate of the silicon oxide film layer, a line y2 is a graph showing an interrelation between the flow rate of $N_2$ and the selectivity of the silicon oxide film layer over the shoulder part of the photoresist layer and a line y3 is a graph showing an interrelation between the flow rate of $N_2$ and the selectivity of the silicon oxide film layer over the shoulder part of the silicon nitride film layer. Additionally, for the above basic etching conditions, when the flow rate of $N_2$ was less than or equal to about 50 sccm, the etching stop occurred.

From the graph y1, it can be seen that, as the flow rate of $N_2$ becomes lower, the etching rate of the silicon oxide film layer becomes higher. As well, in the case of the graphs y2 and y3, the lower the flow rate of $N_2$ is, the higher the selectivities of the silicon oxide film layer over the shoulder of the photoresist layer and over the shoulder of the silicon nitride film layer are.

In this regard, while an increasing rate of the selectivity of the silicon oxide film layer over the shoulder of the silicon nitride film layer is significantly large as the flow rate of $N_2$ becomes reduced. In addition, the selectivity of the silicon oxide film layer over the shoulder part of the photoresist layer is slightly increased, however, remains almost unchanged with the reduction of the flow rate of $N_2$. To sum up, the reduction in the flow rate of $N_2$ results in increased etching rate of the silicon oxide film layer and the improved selectivity of the silicon oxide film layer over the silicon nitride film layer while the selectivity of the silicon oxide film layer over the photoresist layer remains almost unchanged.

Accordingly, the desirable flow rate of $N_2$ is 15 preferably within a range at which the selectivity of the silicon oxide film layer over the silicon nitride film layer is greater than or equal to about 20.0, and more preferably, within a range at which the selectivity of the silicon oxide film layer over the silicon nitride film layer is greater than or equal to about 30.0, practically. Specifically, under the above-basic etching conditions, the flow rate of $N_2$ is preferably less than or equal to about 170 sccm, and more preferably, less than or equal to about 120 sccm as shown in the graph y3. At this time, when the flow rate of $N_2$ becomes excessively low, the etching stop occurs. Therefore it is necessary that the flow rate of $N_2$ is at least more than or equal to about 50 sccm. Resultantly, the flow rate of $N_2$ is preferably greater than or equal to about 50 sccm and less than or equal to about 170 sccm, and more preferably greater than or equal to about 80 sccm and less than or equal to about 120 sccm.

In the case of converting the above-mentioned flow rate into a flow rate ratio, a ratio of the flow rate of $N_2$ to the flow rate of $C_4F_6$ is preferably greater than or equal to about 50/16 and less than or equal to about 170/16 (i.e. greater than or equal to about 25/8 and less than or equal to about 85/8), and more preferably greater than or equal to about 80/16 and less than or equal to about 120/16 (i.e. greater than or equal to about 10/2 and less than or equal to about 15/2). Additionally, a ratio of the flow rate of gaseous mixture, which contains $N_2$ and $O_2$, acting as the deposit removing gas to the flow rate of $C_4F_6$, acting as the etching gas, is preferably greater than or equal to about 60/16 and less than or equal to about 180/16 (greater than or equal to about 15/4 and less than or equal to about 45/4), and more preferably greater than or equal to about 90/16 and less than or equal to about 130/16 (greater than or equal to about 45/8 and less than or equal to about 65/8) Furthermore, as the deposit removing gas, a ratio of the flow rate of $N_2$ to the flow rate of $O_2$ is preferably greater than or equal to about 50/10 and less than or equal to about 170/10 (greater than or equal to about 5 and less than or equal to about 17), and more preferably greater than or equal to about 80/10 and less than or equal to about 120/10 (greater than or equal to about 8 and less than or equal to about 12)

Based on the above description, when the layered structure of films shown in FIG. 2A is etched by a plasma under the preferable etching conditions, the contact hole 210 may be formed in a self-aligning manner between the gates 202 while the silicon nitride film layer 204, acting as the protective film layer of the gates 202, is prevented from being etched as shown in FIG. 2B.

With respect to this, test results for the conventional etching method are presented for a comparison with the test results by the etching method in accordance with the present invention. In this regard, the conventional etching was conducted under conditions where the high frequency power applied to the upper electrode 122 was 1500 W at 60 MHz, the high frequency power (bias power) applied to the lower electrode 106 was about 1300 W at about 2 MHz, a flow rate ratio of $C_5F_8$/Ar/$O_2$ (a flow rate of $C_5F_8$/a flow rate of Ar/a flow rate of $O_2$) was about 16 sccm/800 sccm/18 sccm, temperatures of the lower and the upper electrodes in the processing chamber 104 were about 40° C. and 60° C., respectively and a temperature of a sidewall of the processing chamber 104 was about 50° C. Pressures of the cooling gas (He gas) as a back pressure gas applied to the center and edges of the backside of the wafer were about 5 Torr and 10 Torr, respectively.

When the layered structure of films as shown in FIG. 2A was etched by a plasma under the conventional etching conditions described above, the following results were obtained. At this time, the following results are average values of respective values measured at the center portion, at the intermediate portion between the end portion and the center portion, and at the end portion of the wafer W.

The etching rate of the silicon oxide film layer was about 500 nm/min, a removed amount t of the etched shoulder (edge) 204a of the silicon nitride film layer 204 was about 8 nm. Additionally, the selectivity of the silicon oxide film layer 206 over the shoulder (edge) 204a of the silicon nitride film layer 204 [the etching rate of the silicon oxide film layer/the etching rate of the shoulder (edge) of the silicon nitride film layer] was about 20.0. The selectivity of the silicon oxide film layer 206 against the shoulder (edge) 204a of the photoresist layer 208 [the etching rate of the silicon oxide film layer/the etching rate of the shoulder part (edge part) of the photoresist layer] was about 6.0.

Through the above description regarding the conventional etching and the etching in accordance with the present invention, it can be seen that in the case of the present invention, $N_2$ is added to the processing gas to select the desired flow rate ratio, thereby preventing the etching stop from occurring and at the same time increasing the etching rate of the silicon oxide film layer 206, acting as the protective film layer. In addition, there improved the etching selectivity of the silicon oxide film layer 206 over the silicon nitride film layer 204, acting as the protective film layer of the gates 202. Therefore, the silicon nitride film layer 204, acting as the protective film layer of the gates 202, is prevented from being etched, thereby capable of forming the contact hole 210 with an improved aspect ratio.

Although, the preferred embodiments in accordance with the present invention have been described in an illustrative manner with reference to the drawings, the present invention is not limited to the embodiments described herein, and it is to be understood that the terminology used is intended to be in the nature of description rather than of limitation. Many modifications and variations of the present invention are possible in light of the above teachings. Therefore, it is to be understood by those skilled in the art that within the scope of the claims attached thereto, the invention may be practiced in different ways from those specifically described.

For example, there is disclosed only the silicon oxide film layer 206 as the silicon-containing oxide film acting as the insulating film layer in the present invention, however an inorganic low-k film, such as a carbon-added silicate (SiOC) film, a hydrogen-added silicate (SiOH) film and a fluorine-added silicate (SiOF) film, may be used instead of the silicon oxide film.

Additionally, the silicon oxide film may be exemplified by a borophosphosilicate glass (BPSG) film, a phosphosilicate glass (PSG) film, a tetraethoxy orthosilane (TEOS) film, a thermal oxide (Th—OX) film or a spin on glass (SOG) film.

Further, in the present invention, only $C_4F_6$ gas is used as fluorocarbon-based gas which rendered to be included in the processing gas, but $C_5F_8$ gas and the like may be used as the fluorocarbon-based gas.

Furthermore, in the present invention, the high frequency power with the frequency of about 60 Hz is applied to the upper electrode of the etching apparatus and the high frequency power with the frequency of about 2 MHz is applied to the lower electrode, however the present invention is not limited to what is explained above, and the high frequency power may be applied to the upper or the lower electrodes of the etching apparatus, or a magnetic field may be formed around the upper and/or the lower electrode.

With respect to this, it is most preferable to use the etching apparatus, in which the high frequency power with the frequency of about 60 Hz is applied to the upper electrode and the high frequency power with the frequency of about 2 MHz is applied to the lower electrode, because the high frequency power applied to the upper electrode serves to control a plasma density and the high frequency power applied to the lower electrode functions to control an ion energy. Consequently, it is controllable, i.e., to attach and remove reaction products (deposits), affecting the etching selectivity.

As well, the etching apparatus may be embodied by an ECR plasma etching apparatus, a helicon wave plasma etching apparatus, a TCP type plasma etching apparatus, and an inductively coupled plasma etching apparatus.

In accordance with the present invention as described 15 above, $N_2$ is added to the processing gas and the flow rate of $N_2$ is desirably selected to prevent the etching from stopping, to increase the etching rate of the silicon oxide film layer, acting as the insulating film layer, and to improve the etching selectivity of the silicon oxide film layer over the silicon nitride film layer, acting as the protective film layer of the gates. Therefore, the silicon nitride film, acting as the protective film layer of the gates, is prevented from being etched and the contact hole with the high aspect ratio may be stably formed securely while assuring an excellent controllability.

While the invention has been shown and described with respect to the preferred embodiment, it will be understood by those skilled in the art that various changes and modifications may be made without departing from the spirit and scope of the invention as defined in the following claims.

The invention claimed is:

1. An etching method comprising:
feeding a processing gas into an airtight processing chamber to generate therein a plasma of the processing gas; and
selectively etching a silicon oxide film against a silicon nitride film, the silicon oxide film being formed on an object to be processed disposed in the processing chamber,
wherein the processing gas is a gaseous mixture including a $C_4F_6$ gas, an oxygen gas, a nitrogen gas and an inert gas, and
wherein an etching selectivity of the silicon oxide film to the silicon nitride film is controlled by adjusting a ratio of a total flow rate of the oxygen gas and the nitrogen gas to a flow rate of the $C_4F_6$ gas, and a ratio of a flow rate of the nitrogen gas to the flow rate of the $C_4F_6$ gas,
wherein the ratio of the flow rate of the nitrogen gas to the flow rate of the $C_4F_6$ gas is greater than or equal to 25/8 and less than or equal to 85/8, and the ratio of the total flow rate of the oxygen gas and the nitrogen gas to the flow rate of the $C_4F_6$ gas is controlled greater than or equal to 15/4 and less than or equal to 45/4, and
wherein the etching selectivity of the silicon oxide film layer to the silicon nitride film is greater than or equal to about 20.

2. The etching method of claim 1, wherein the processing gas is a gaseous mixture consisting of the $C_4F_6$ gas, the oxygen gas, the nitrogen gas and the inert gas.

3. The etching method of claim 1, wherein an upper and a lower electrode are installed opposite to face each other in the processing chamber, a first high frequency power is applied to the upper electrode and a second high frequency power is applied to the lower electrode, a frequency of the second high frequency power is lower than that of the first high frequency power.

4. The etching method of claim 3, wherein the frequency of the first high frequency power is 60 MHz and that of the second high frequency power is 2 MHz.

5. The etching method of claim 1, wherein the silicon nitride film exists under the silicon oxide film.

6. The etching method of claim 5, wherein the silicon oxide film is etched in a self-alignment contact process.

7. An etching method comprising:
feeding a processing gas into an airtight processing chamber to generate therein a plasma of the processing gas; and
selectively etching a silicon oxide film against a silicon nitride film, the silicon oxide film being formed on an object to be processed disposed in the processing chamber,
wherein the processing gas is a gaseous mixture including a $C_4F_6$ gas, an oxygen gas, a nitrogen gas and an inert gas, and
wherein an etching selectivity of the silicon oxide film to the silicon nitride film is controlled by adjusting a ratio of a total flow rate of the oxygen gas and the nitrogen gas to a flow rate of the $C_4F_6$ gas, and a ratio of a flow rate of the nitrogen gas to the flow rate of the $C_4F_6$ gas,
wherein, in the processing gas, the ratio of the flow rate of the nitrogen gas to the flow rate of the $C_4F_6$ gas is greater than or equal to 25/8 and less than or equal to 85/8, and a ratio of the flow rate of the nitrogen gas to a flow rate of the oxygen gas is greater than or equal to 5 and less than or equal to 17, and wherein the etching selectivity of the silicon oxide film layer to the silicon nitride film is greater than or equal to about 20.

8. The etching method of claim 7, wherein the processing gas is a gaseous mixture consisting of the $C_4F_6$ gas, the oxygen gas, the nitrogen gas and the inert gas.

9. The etching method of claim 7, wherein an upper and a lower electrode are installed opposite to face each other in the processing chamber, a first high frequency power is applied to the upper electrode and a second high frequency power is applied to the lower electrode, a frequency of the second high frequency power is lower than that of the first high frequency power.

10. The etching method of claim 9, wherein the frequency of the first high frequency power is 60 MHz and that of the second high frequency power is 2 MHz.

11. The etching method of claim 7, wherein the silicon nitride film exists under the silicon oxide film.

12. The etching method of claim 11, wherein the silicon oxide film is etched in a self-alignment contact process.

* * * * *

UNITED STATES PATENT AND TRADEMARK OFFICE
CERTIFICATE OF CORRECTION

PATENT NO.        : 7,943,524 B2
APPLICATION NO.   : 11/780797
DATED             : May 17, 2011
INVENTOR(S)       : Noriyuki Kobayashi et al.

It is certified that error appears in the above-identified patent and that said Letters Patent is hereby corrected as shown below:

Abstract, line 2, please change "for 5 gate" to --for gate--.

Abstract, line 7, please change "For the 10 processing gas" to --For the processing gas--.

Abstract, line 12, please change "holes of 15 high aspect" to --holes of high aspect--.

Column 3, lines 52-53, please change "processing vessel 1 $0_2$" to --processing vessel 102--.

Column 3, lines 56-57, please change "lower 5 electrode" to --lower electrode--.

Column 4, lines 8-9, please change "high 25 frequency" to --high frequency--.

Column 4, line 34, please change "processing vessel 1 $0_2$" to --processing vessel 102--.

Column 5, lines 1-2, please change "included 10 as" to --included as--.

Column 6, lines 3-4, please change "491.3 nm/mm, 478.0 nm/mm and 449.3 nm/mm" to --491.3 nm/min, 478.0 nm/min and 449.3 nm/min--.

Column 6, lines 7-8, please change "the 10 silicon oxide" to --the silicon oxide--.

Column 6, line 23, please change "a—14—removed amount" to --a removed amount--.

Column 6, line 37, please change "508.7 nm/mm, 502.0 nm/mm and 474.0 nm/mm" to --508.7 nm/min, 502.0 nm/min and 474.0 nm/min--.

Column 6, line 51, please change "in 5 other words" to --in other words--.

Signed and Sealed this
Eighteenth Day of October, 2011

David J. Kappos
*Director of the United States Patent and Trademark Office*

CERTIFICATE OF CORRECTION (continued)
U.S. Pat. No. 7,943,524 B2

Column 6, line 58, please change "539.3 nm/mm, 524.0 nm/mm, and 500.0 nm/mm" to --539.3 nm/min, 524.0 nm/min, and 500.0 nm/min--.

Column 7, line 42, please change "is 15 preferably" to --is preferably--.

Column 9, lines 54-55, please change "as described 15 above" to --as described above--.